(12) United States Patent
Chien

(10) Patent No.: US 6,936,521 B2
(45) Date of Patent: Aug. 30, 2005

(54) ALIGNMENT MARK AND ALIGNMENT METHOD USING THE SAME FOR PHOTOLITHOGRAPHY TO ELIMINATING PROCESS BIAS ERROR

(75) Inventor: Tony Chien, Hsinchu (TW)

(73) Assignee: Promos Technologies Inc., Hsinchu (TW)

( * ) Notice: Subject to any disclaimer, the term of this patent is extended or adjusted under 35 U.S.C. 154(b) by 64 days.

(21) Appl. No.: 10/750,805

(22) Filed: Jan. 2, 2004

(65) Prior Publication Data

US 2005/0023709 A1 Feb. 3, 2005

(51) Int. Cl.⁷ .............................................. H01L 21/76
(52) U.S. Cl. ...................................... 438/401; 257/797
(58) Field of Search ................................. 438/401, 462; 257/797; 356/401

(56) References Cited

U.S. PATENT DOCUMENTS 6,043,134 A * 3/2000 Bishop ....................... 438/401
6,172,409 B1 * 1/2001 Zhou ........................... 257/620

* cited by examiner

Primary Examiner—Tuan H. Nguyen
(74) Attorney, Agent, or Firm—Pro-Techtor International Services

(57) ABSTRACT

An alignment mark is made of at least two nonparallel trenches having two reducing-width-to-zero ends. The displacement bias error, produced by a process bias error, of the centerlines of the trenches is zero where the width of the two trenches is zero. Hence, the alignment target on a substrate can be reproduced.

18 Claims, 4 Drawing Sheets

ALIGNMENT MARK AND ALIGNMENT METHOD USING THE SAME FOR PHOTOLITHOGRAPHY TO ELIMINATING PROCESS BIAS ERROR

BACKGROUND OF THE INVENTION

1. Field of Invention

The present invention relates to a manufacturing process of semiconductor integrated circuit. More particularly, the present invention relates to an alignment mark and a photolithography alignment method using the same for eliminating process bias error.

2. Description of Related Art

The complexity of integrated circuit design increases as the integration of the integrated circuit increases, and the critical dimension of the integrated circuit is continually reduced. Since the integrated circuit is formed by overlapping multiple layers of circuit patterns, the alignment accuracy requirement of each layer of circuit pattern is continually higher and harder to achieve. In particular, the gravity of the alignment accuracy problem is increased when a thin film on alignment marks has an asymmetrical profile, which usually results from asymmetrically depositing the thin film or chemical mechanical polishing the thin film.

For a clearer understanding the impact of the asymmetrical profile of a thin film on alignment accuracy for overlapping layers of circuit patterns, a top view of a conventional alignment mark, box-in-box, is shown in FIG. 1. In FIG. 1, a box-in-box alignment mark is formed by the following steps. A square trench 110 is formed in a substrate 100. The border length of the square trench 110 is about 50 µm, and the depth of the square trench 110 is about 0.3–0.6 µm. A thin film is deposited on the substrate 100. Ideally, a smaller square trench 130 will be formed in the center of the square trench 110. Both the geometric centers of the square 110 and 130 are at position C1. However, if the profile of the thin film is asymmetrical, another smaller square trench 140 is formed instead of the square trench 130. The geometric center of the square trench 140 is at position C2, which is displaced from the position C1. Since an alignment target, i.e. the geometric center of the square trench formed by this thin film, is needed when a photolithography process is performed for patterning this thin film, an alignment bias error occurs if the geometric center of the square trench 140 at position C2 is displaced from the ideal geometric center at position C1.

For example, the polishing direction of chemical mechanical polishing is anisotropic, and an asymmetrical profile of a thin film thus results. FIG. 2 shows a cross-sectional view of a thin film having an asymmetrical profile caused by chemical mechanical polishing. A square trench 210 having a geometric center C1 is formed on a substrate 200. A tungsten metal layer is conformally deposited on the substrate 200. Chemical mechanical polishing is performed to remove the tungsten layer higher than the level of the substrate 200 to form a tungsten plug in the integrated circuit regions (not shown in FIG. 2) and tungsten layer 220 in the square trench 210. If the polishing direction is from the right to the left of FIG. 2, the thickness of the tungsten layer at the right hand side (B2) is larger than that at the left hand side (B1). After depositing another layer of metal layer 230, the profile of the metal layer 230 is asymmetrical with respect to the square trench 210. Hence, the geometric center is moved from position C1 to position C2, and the alignment target for patterning the metal layer 230 is at position C2.

Thus, an alignment bias error occurs. Another conventional bar-in-bar alignment mark also utilizes the same principle to align layers of circuit patterns. Therefore, similar problems are also encountered.

SUMMARY OF THE INVENTION

In one aspect, the present invention provides an alignment method for eliminating process bias error to fix the position of an alignment target.

In another aspect, the present invention provides an alignment method for eliminating process bias error. When a thin film, having an asymmetrical profile, is deposited on an alignment mark, the position of an alignment target is not changed by the film deposition.

In still another aspect, the present invention provides an alignment method for eliminating process bias error to increase alignment accuracy for aligning each layer of circuit pattern.

In yet another aspect, the present invention provides an alignment mark for eliminating process bias error to reproduce the position of an alignment target on a substrate.

In accordance with the foregoing and other aspects of the present invention, an alignment method for eliminating process bias error is provided. First, at least three first trenches on a mark area are formed to form a first polygon having a first geometric center on a substrate. The shape of the first trenches is a bar with two reducing-width-to-zero ends. The first trenches are used as an alignment mark. A thin film is deposited on the substrate, and the thin film forms second trenches respectively in the first trenches. Two ends of each second trench are connected with a second line to form a second polygon having a second geometric center. A photolithography process for patterning the thin film is performed, and the second geometric center is used as an alignment target.

According to a preferred embodiment, the first trenches can also be spindle shaped. The first and second polygons can be triangles, squares, or other polygons.

In accordance with the foregoing and other aspects of the present invention, an alignment method for eliminating process bias error is provided. At least two first trenches are formed on a mark area of a substrate, and the two first trenches are nonparallel. Hence, an extension line of the two first trenches can cross each other at a first intersection. The shape of the first trenches is a bar with two reducing-width-to-zero ends. The first trenches are used as an alignment mark. A thin film is deposited on the substrate, and the thin film forms second trenches respectively on the first trenches. Two ends of each second trench are connected with a second line to cross each other on a second intersection. A photolithography process is performed, and the second intersection is used as an alignment target.

According to a preferred embodiment, the first trenches can also be spindle shaped.

In accordance with the foregoing and other aspects of the present invention, an alignment method for eliminating process bias error is provided. At least a first trench is formed on a mark area of a substrate. The shape of the first trench is a crossbar with four reducing-width-to-zero ends, and two first lines respectively connect opposite two ends of the first trench to form a first cross. The first trench is used as an alignment mark. A thin film is deposited on the substrate, and the thin film forms a second trench on the first trench. The opposite two ends of the second trench are respectively connected with two second lines to form a second cross. A photolithography process is performed, and a center of the second cross is used as an alignment target.

According to a preferred embodiment, the shape of the first trench is a cross-spindle.

In light of forgoing, trenches of bar or spindle shape with two reducing-width-to-zero ends are used as alignment marks. A feature that a bias error is zero when the width of the trench is zero is utilized to reproduce the alignment target on the first layer on a substrate. Therefore, no matter whether the profile of the film on the alignment marks is symmetrical or asymmetrical, the alignment target can be accurately found to perform a photolithography process.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings.

For solving the problems encountered by the prior arts, i.e. the alignment bias error produced by the asymmetrical profile of a thin film formed on alignment marks, the present invention provides an alignment mark and a photolithography alignment method using the same for eliminating process bias error.

Figure 1:
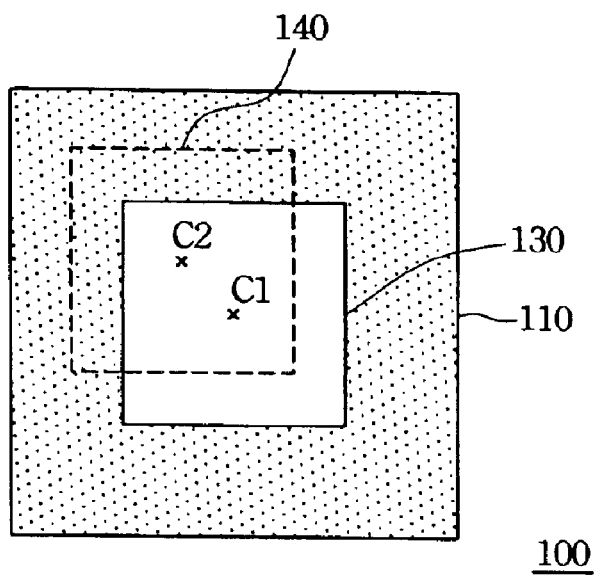
FIG. 1 is a top view of a conventional box-in-box alignment mark.
Figure 2:
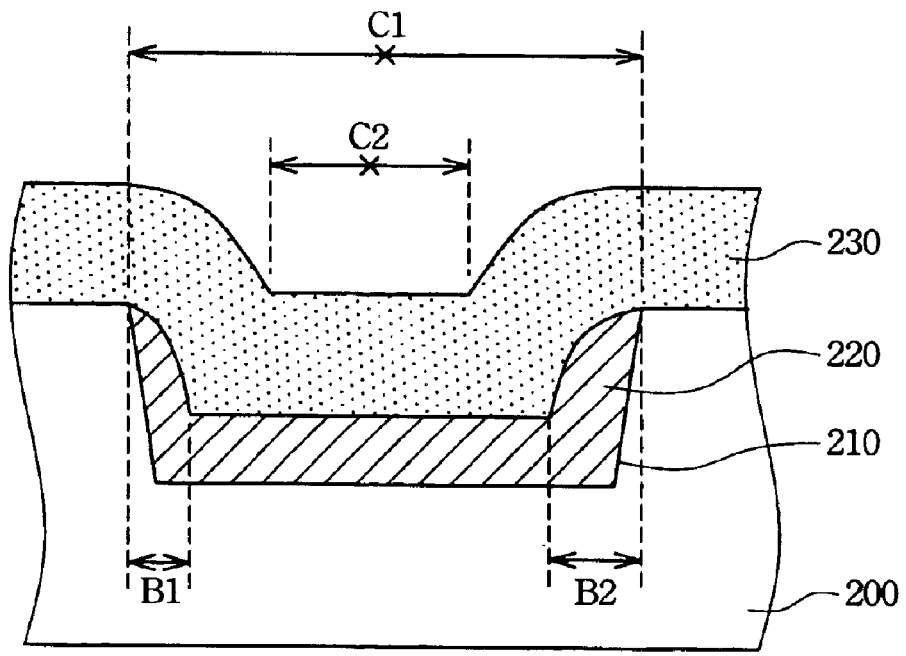
FIG. 2 is a cross-sectional view of a thin film having an asymmetrical profile caused by chemical mechanical polishing.
Figure 3:
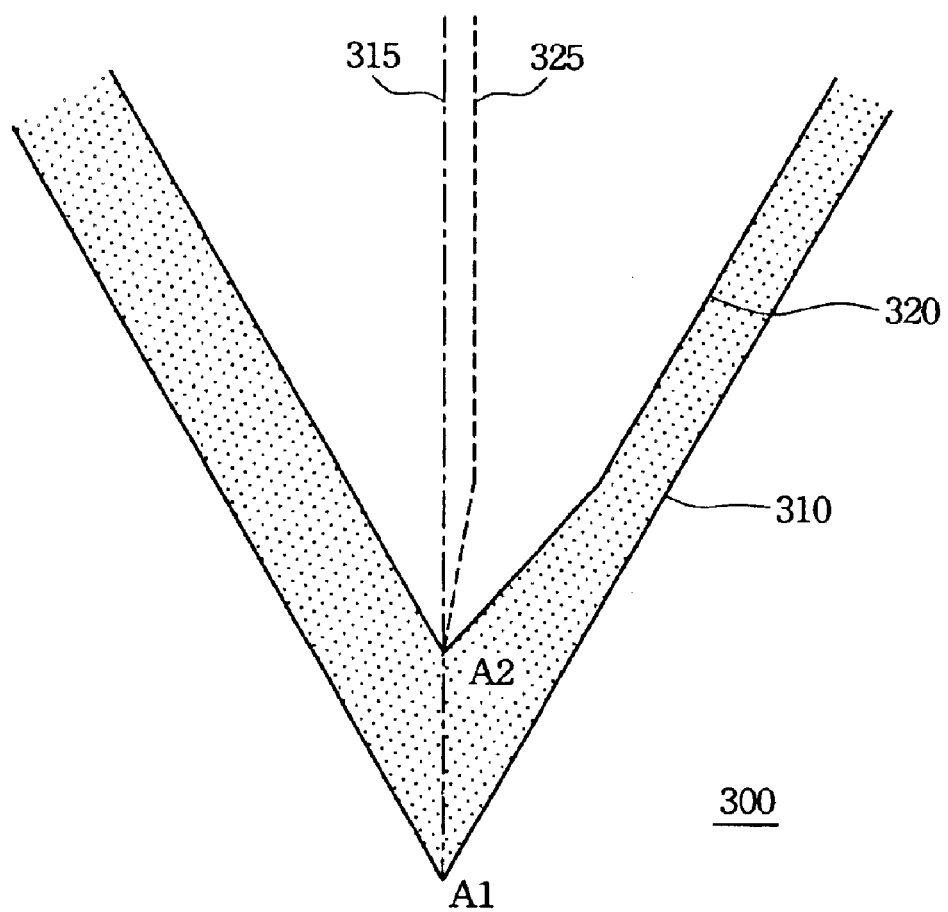
FIG. 3 is a partial enlarged top view of an alignment mark according to a preferred embodiment of the present invention.

A partial enlarged top view of an alignment mark according to a preferred embodiment of the present invention is shown in FIG. 3. In FIG. 3, a trench 310 is formed on a substrate 300 to be an alignment mark. A film is subsequently formed on the substrate 300, and a trench 320 is simultaneously formed in the trench 310. An asymmetrical profile of the thin film in the trench 310 can be produced by various process bias errors. Hence, the centerline 325 of the trench 320 and the centerline 315 of the trench 310 are not overlapped. The only exception is at the position A2. The reason is that the width of the trench 310 at position A1 is zero and the width of the trench 320 at the position A2 is also zero. Therefore, the displacement bias error of the centerline produced by process bias errors is zero, too.

Figure 4:
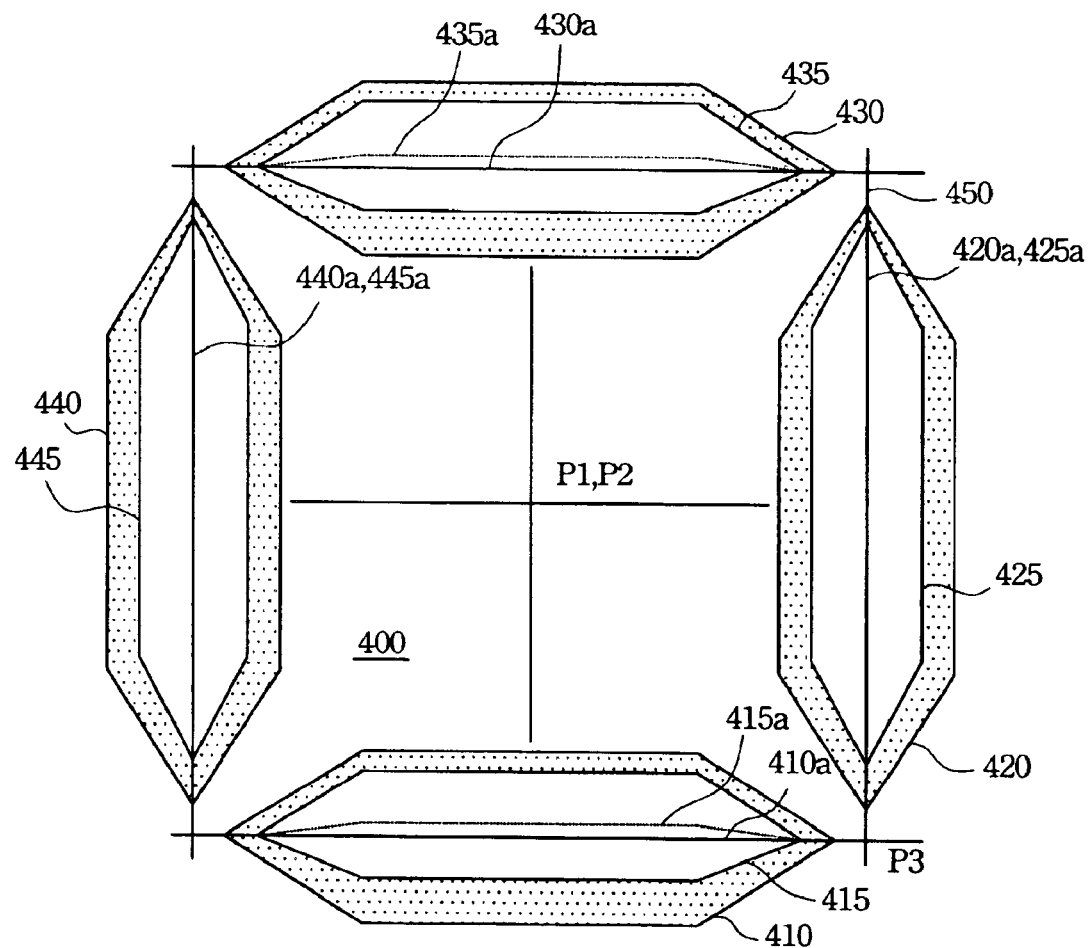
FIG. 4 is a top view of an alignment mark according to a preferred embodiment of this invention.

Accordingly, a profile of an alignment mark is designed by utilizing the feature described above in a preferred embodiment of the present invention. FIG. 4 is a top view of an alignment mark according to a preferred embodiment of this invention. In FIG. 4, the four bar-shape trenches 410, 420, 430, and 440 on a substrate 400 are used as alignment marks and located at the four edges of a square. The width of the four trenches 410, 420, 430, and 440 are reduced to zero towards the ends. Centerlines 410a, 420a, 430a, and 440a of the trenches 410, 420, 430, and 440 respectively pass through the two ends of the trenches 410, 420, 430, and 440 to form a square 450. The geometric center of the square 450 is at position P1, which is used as an alignment target for a photolithography process.

If the subsequent processes are, for example, depositing a tungsten metal layer, performing chemical mechanical polishing, and depositing a metal layer, the detail description for these processes is as follows. A tungsten metal layer is deposited on a substrate 400. A chemical mechanical polishing process is performed to remove the tungsten layer higher than the level of the surface of the substrate 400. A metal layer is deposited on the substrate 400, and then four trenches 415, 425, 435, and 445 are formed in the trenches 410, 420, 430, and 440. The centerlines of the trenches 415, 425, 435, and 445 are 415a, 425a, 435a, and 445a.

In FIG. 4, the polishing direction is from the bottom to the top of the FIG. 4. Therefore, the positions of the trenches 415, 425, 435, and 445 are all moved upward. As a result, the centerlines 415a and 435a of the trenches 415 and 435 are also displaced upward, but the positions of the centerlines 425a and 445a of the trenches 425 and 445 are not affected by the chemical mechanical polishing. However, since the width of the two ends of the trenches 415, 425, 435, and 445 are zero, the displacement of the centerlines 415a, 425a, 435a, and 445a at the two ends of the trenches 415, 425, 435, and 445 are also zero. The result is that each line connecting the two ends of the trenches 415, 425, 435, and 445 respectively overlaps with the centerlines 410a, 420a, 430a, and 440a of the trenches 410, 420, 430, and 440. That is, the lines connecting the two ends of the trenches 415, 425, 435, and 445 also form the square 450. Therefore, the alignment target P2 on the metal layer coincides with the alignment target P1 on the substrate. The alignment accuracy is no longer affected by any process bias errors.

Moreover, two lines that are not parallel certainly have an intersection, and any two centerlines of two non-parallel trenches of the trenches 410, 420, 430, and 440 in FIG. 4 hence have an intersection, too. For example, the centerline 410a intersects the centerline 420a at position P3. Therefore, position P3 can also be an alignment target. A particular example is described in the next.

Figure 5:
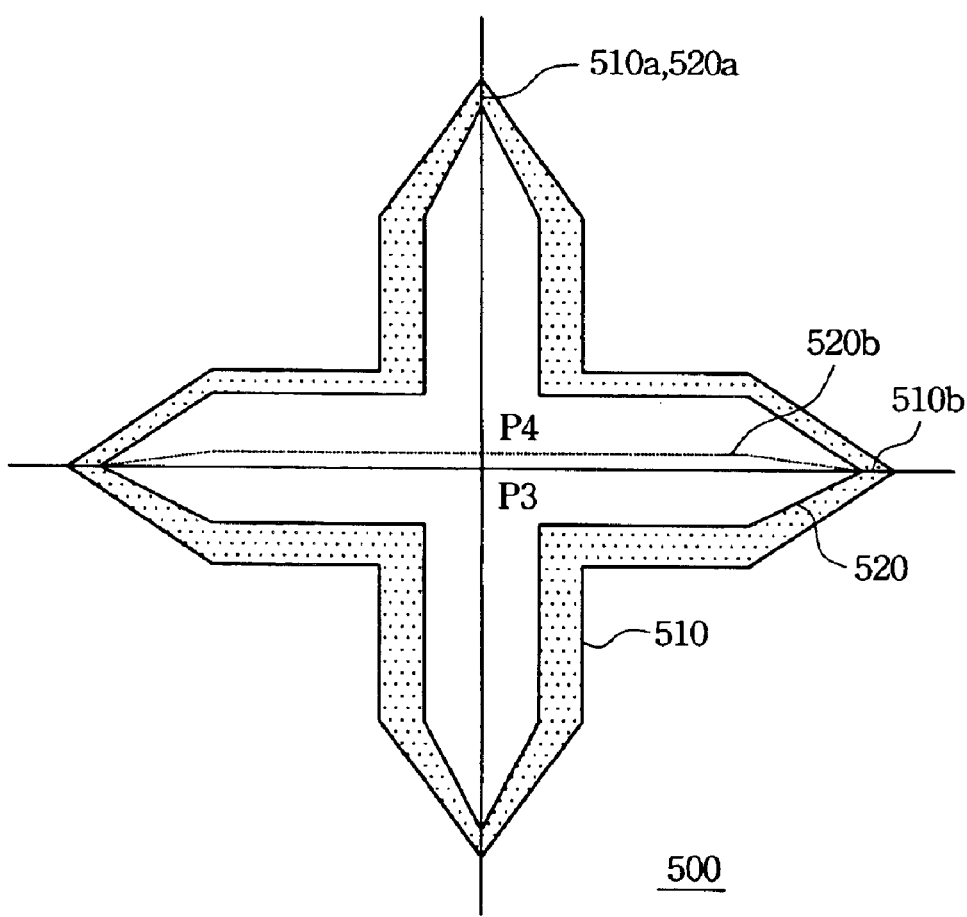
FIG. 5 is a top view of an alignment mark according to another preferred embodiment of this invention.

FIG. 5 is a top view of an alignment mark according to another preferred embodiment of this invention. In FIG. 5, a crossbar trench 510 having four reducing-width-to-zero ends is formed in a substrate 500 to be an alignment mark. Two centerlines 510a and 510b of the crossbar trench 510 intersect at position P3. This is a special case of the trench 415 intersecting the trench 425 at a right angle in FIG. 4.

Similarly, after some processes, a thin film is deposited on the substrate 500 to form a crossbar trench 520 in the crossbar trench 510. The asymmetrical profile of the thin film is assumed to be similar to that in FIG. 4. Then, the centerline 520a of the crossbar trench 520 overlaps the centerline 510a of the crossbar trench 510, and the centerline 520b of the crossbar trench 520 is displaced upward above the centerline 510b of the crossbar trench 510 in FIG. 5. Therefore, the centerline 520a intersects the centerlines 520b at position P4, which does not overlap with the position P3. However, if the opposite two ends of the crossbar trench 520 are respectively connected with two lines, the two lines are the two centerlines 510a and 510b precisely and intersect each other at position P3, too. Hence, before performing a photolithography process, the opposite two ends of the crossbar trench 520 are connected with two lines, respectively, to find position P3. The position P3 can be an alignment target for a high-accuracy alignment.

Furthermore, the spirit of this invention is the use of trenches having at least two reducing-width-to-zero ends as alignment marks. Therefore, the shape of the trench is not limited by the bar-shaped trenches as shown in the figures of the preferred embodiments of this invention. Trenches of other shapes, such as spindles having reducing-width-to-zero ends can also be applied. Hence, at least two non-parallel trenches having at least two reducing-width-to-zero ends are only needed to draw two lines to intersect with each other at a fixed position serving as an alignment target.

From the preferred embodiments of this invention, trenches with at least two reducing-width-to-zero ends are utilized as alignment marks. Where the width of the trench is zero, the alignment bias error, caused by process bias error, is also zero to reproduce the alignment target on the substrate. Therefore, whether the profile of a thin film on the alignment marks are symmetric or asymmetrical, the alignment target can be accurately found to perform a photolithography process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An alignment method for eliminating process bias error, comprising:
    forming at least three first trenches on a mark area to form a first polygon having a first geometric center on a substrate, a shape of the first trenches being a bar with two reducing-width-to-zero ends;
    depositing a thin film on the substrate, the thin film forming second trenches in the first trenches, respectively;
    connecting two ends of each second trench with a second line to form a second polygon having a second geometric center; and
    performing a photolithography process using the second geometric center as an alignment target for patterning the thin film.

2. The method of claim 1, wherein a shape of the first trenches is a spindle.

3. The method of claim 1, wherein the first polygon and the second polygon are triangles.

4. The method of claim 1, wherein the first polygon and the second polygon are squares.

5. The method of claim 1, wherein the thin film comprises a metal film.

6. An alignment method for eliminating process bias error, comprising:
    forming at least two first trenches, being non-parallel, on a mark area of a substrate so that respective extension lines of the two first trenches intersect each other at a first intersection, a shape of the first trenches being a bar with two reducing-width-to-zero ends;
    depositing a thin film on the substrate, the thin film forming second trenches in the first trenches, respectively;
    connecting two ends of each second trench with a second line, wherein the second lines intersect with each other on a second intersection; and
    performing a photolithography process using the second intersection as an alignment target for patterning the thin film.

7. The method of claim 6, wherein the shape of the first trenches is a spindle.

8. The method of claim 6, wherein the thin film comprises a metal film.

9. An alignment method for eliminating process bias error, comprising:
    forming at least a first trench on a mark area of a substrate, a shape of the first trench being a crossbar with four reducing-width-to-zero ends, two first lines respectively connecting two opposite ends of the first trench to form a first cross;
    depositing a thin film on the substrate, the thin film forming a second trench in the first trench;
    connecting opposite two ends of the second trench with second lines to form a second cross; and
    performing a photolithography process by using a center of the second cross as an alignment target for patterning the thin film.

10. The method of claim 9, wherein the shape of the first trenches is a cross-spindle.

11. The method of claim 9, wherein the thin film comprises a metal film.

12. An alignment mark for eliminating process bias error, comprising:
    at least three trenches on a mark area to form a polygon having a geometric center on a substrate, a shape of the trenches being a bar with two reducing-width-to-zero ends, and a line, connecting the two ends of each trench, being parallel to two edges of the bar.

13. The alignment mark of claim 12, wherein the shape of the trenches is a spindle.

14. The alignment mark of claim 12, wherein the polygon is a triangle.

15. The alignment mark of claim 12, wherein the polygon is a square.

16. An alignment mark for eliminating process bias error, comprising:
    at least two trenches, being non-parallel, on a mark area of a substrate so that respective extension lines of the two trenches cross each other at an intersection, a shape of the trenches being a bar with two reducing-width-to-zero ends, and a line, connecting two ends of each trench, being parallel to two edges of the bar.

17. The alignment mark of claim 16, wherein the shape of the trenches is a spindle.

18. The alignment mark of claim 16, wherein the two trenches cross over each other to form a cross-shaped trench.

* * * * *